United States Patent
Terao et al.

(10) Patent No.: US 11,830,560 B2
(45) Date of Patent: Nov. 28, 2023

(54) TRACK-AND-HOLD CIRCUIT

(71) Applicant: Nippon Telegraph and Telephone Corporation, Tokyo (JP)

(72) Inventors: Naoki Terao, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/793,628

(22) PCT Filed: Jan. 28, 2020

(86) PCT No.: PCT/JP2020/002895
§ 371 (c)(1),
(2) Date: Jul. 18, 2022

(87) PCT Pub. No.: WO2021/152687
PCT Pub. Date: Aug. 5, 2021

(65) Prior Publication Data
US 2023/0048012 A1 Feb. 16, 2023

(51) Int. Cl.
*G11C 27/02* (2006.01)
*H03K 17/62* (2006.01)
*H03M 1/12* (2006.01)

(52) U.S. Cl.
CPC ......... *G11C 27/02* (2013.01); *H03K 17/6285* (2013.01); *H03M 1/124* (2013.01)

(58) Field of Classification Search
CPC .... G11C 27/02; H03K 17/6285; H03M 1/124
See application file for complete search history.

(56) References Cited

U.S. PATENT DOCUMENTS

| 2006/0114033 A1* | 6/2006 | Nakasha | G11C 27/02 327/91 |
| 2021/0012848 A1 | 1/2021 | Katsurai et al. | |

FOREIGN PATENT DOCUMENTS

| JP | H0729391 A | 1/1995 |
| JP | H1092190 A | 4/1998 |
| JP | 2009230842 A | * 10/2009 |
| JP | 2009230842 A | 10/2009 |
| JP | 2017153021 A | 8/2017 |
| WO | 2019172171 A1 | 12/2019 |

OTHER PUBLICATIONS

Yamanaka et al., "A 20-Gs/s Track-and-Hold Amplifier in InP HBT Technology" IEEE Transactions on Microwave Theory and Techniques, vol. 58, No. 9, Sep. 2010, pp. 2334-2339.

* cited by examiner

*Primary Examiner* — Daniel C Puentes
(74) *Attorney, Agent, or Firm* — Slater Matsil, LLP

(57) ABSTRACT

A track-and-hold circuit includes: a transistor, in which a base is connected to a signal input terminal, a power supply voltage is applied to a collector, and an emitter is connected to a first signal output terminal; a transistor in which a base is connected to the signal input terminal, the power supply voltage is applied to a collector, and an emitter is connected to a second signal output terminal; capacitors; a constant current source; and a switch circuit alternately turning the transistors to an ON state in response to differential clock signals.

13 Claims, 10 Drawing Sheets

US 11,830,560 B2

TRACK-AND-HOLD CIRCUIT

CROSS-REFERENCE TO RELATED APPLICATIONS

This application is a national phase entry of PCT Application No. PCT/JP2020/002895, filed on Jan. 28, 2020, which application is hereby incorporated herein by reference.

TECHNICAL FIELD

The present invention relates to a track-and-hold circuit that alternately repeats track modes and hold modes at the timing synchronized with a clock signal.

BACKGROUND

Analogue-to-digital converters (ADCs) are widely used devices for communication and measurement. The ADC converts the input voltage, which is an analogue signal, into a quantized digital value at the timing synchronized with a clock signal and outputs a digital code thereof. In many cases, the ADC often includes a track-and-hold circuit at a front end portion (refer to Non-Patent Literature 1).

As shown in FIG. 5, a track-and-hold circuit 100 is a circuit that alternately repeats a track mode Mt, in which the output signal Vout follows the input signal Vin, and a hold mode Mh, which keeps the output signal Vout constant, at the timing synchronized with a clock signal Vck.

One of the reasons why the track-and-hold circuit is used at the front end portion of the ADC is that the ADC takes a certain amount of time for analogue-to-digital conversion, and therefore, it is necessary to retain the input signal during the conversion.

Another reason to use the track-and-hold circuit at the front end portion of the ADC is to reduce the noise effect by clock jitter. Since the timing of the clock signal is not at perfectly equal time intervals, statistical variation occurs in the timing of retaining the input signal. If there is such clock jitter, the output from the ADC is observed as if noise is superimposed thereon.

By using a track-and-hold circuit with very low clock jitter at the front end portion, even if the clock jitter occurs slightly in the ADC in the latter part, there is no noise effect if the clock jitter is within a hold time of the track-and-hold circuit.

Since, in particular, the latest state-of-the-art ADCs are difficult to reduce the clock jitter, the ADCs cannot increase the speed thereof while keeping noise levels within a practical range; accordingly, the clock jitter is the factor in inhibiting speeding up. Therefore, speeding up of the track-and-hold circuit is effective for speeding up of the ADC.

In many cases, an analogue circuit is configured by connecting switching elements called transistors, resistors, capacitors, and so on. There are several types of transistors, but bipolar transistors are often used in analogue circuits in which high-speed operation is required. As a circuit configuration for the existing track-and-hold circuits using the bipolar transistors, those called switched emitter followers are well known.

A typical configuration of a conventional track-and-hold circuit using bipolar transistors is shown in FIG. 6. In FIG. 6, VCC and VEE are power supply voltages, Vin is an input signal, Vout is an output signal, and Vck+ and Vck− are clock signals. The clock signals Vck+ and Vck− are differential signals. In addition, (const.) in FIG. 6 indicates that the voltage or the current is constant regardless of time.

The track-and-hold circuit is configured of bipolar transistors M10 to M12, a capacitor Chold, and a constant current source IS. The constant current source IS is configured of transistors, and so on in many cases. IEE1 and IEE2 are currents flowing into the constant current source IS from the emitters of the bipolar transistors M11 and M12. Assuming that the current flowing to the constant current source IS is IEE, then IEE1+IEE2=IEE due to Kirchhoff's current law.

The basic operation of the track-and-hold circuit in FIG. 6 will be described using FIGS. 7A to 7E. Here, the waveforms of the currents IEE1 and IEE2, when the differential clock signals Vck+ and Vck− with a period Tck shown in FIG. 7A and the input signal Vin shown in FIG. 7B are applied to the track-and-hold circuit, are shown in FIGS. 7C and 7D, and the waveform of the output signal Vout is shown in FIG. 7E. In FIGS. 7A to 7E, t0, t1, t2, t3, and t4 represent times. The times t0 to t4 are arranged with constant intervals Tck/2.

When the clock signal is High, that is, Vck+>Vck− (when the time t satisfies $t0 \leq t \leq t1$ or $t2 \leq t \leq t3$), the transistor M11 is turned OFF and the transistor M12 is turned ON; therefore, IEE1=IEE, and IEE2=0. At this time, since the PN junction between the base and the emitter of the transistor M10 is in the ON state, the emitter voltage of the transistor M10 (the output signal Vout) follows the input signal Vin. In other words, when the time t satisfies $t0 \leq t \leq t1$ or $t2 \leq t \leq t3$, the track-and-hold circuit is in the track mode.

On the other hand, when the clock signal is Low, that is, Vck+<Vck− (when the time t satisfies $t1 \leq t \leq t2$ or $t3 \leq t \leq t4$), the transistor M11 is turned ON and the transistor M12 is turned OFF; therefore, IEE1=0, and IEE2=IEE. Consequently, since no current flows to the transistor M10 and the PN junction between the base and the emitter of the transistor M10 is in the OFF state, the base and the emitter of the transistor M10 are electrically separated. At this time, the emitter voltage of the transistor M10 (the output signal Vout) at the moment when the clock signal changes from High to Low is retained in the capacitor Chold; therefore, the output signal Vout is kept at a constant value while the clock signal is Low. In other words, when the time t satisfies $t1 \leq t \leq t2$ or $t3 \leq t \leq t4$, the track-and-hold circuit is in the hold mode.

As described above, the basic operation of the track-and-hold circuit is to alternately repeat the track mode and the hold mode in accordance with High/Low of the clock signal.

It is clear that the data rate of the track-and-hold circuit, that is, the number of times to obtain data per unit time, depends on the clock frequency. However, due to the constraint conditions of the analogue circuits, specifically, parasitic resistance and parasitic capacitance existing in transistors and wiring, the frequency of the clock signal that can be inputted has an upper limit. The upper limit of the frequency of the clock signal is a main factor in limiting the speed of the track-and-hold circuit.

CITATION LIST

Non-Patent Literature

Non-Patent Literature 1: S. Yamanaka, K. Sano, and K. Murata, "A 20-Gs/s Track-and-Hold Amplifier in InP HBT Technology," in IEEE Transactions on Microwave Theory and Techniques, vol. 58, No. 9, pp. 2334-2339, September 2010.

SUMMARY

Technical Problem

Embodiments of the present invention have been made to solve the above problems, and has as an object to speed up the data rate of the track-and-hold circuit.

Means for Solving the Problem

A track-and-hold circuit of embodiments of the present invention includes: a first transistor, in which a base is connected to a signal input terminal, a power supply voltage is applied to a collector, and an emitter is connected to a first signal output terminal; a second transistor, in which a base is connected to the signal input terminal, the power supply voltage is applied to a collector, and an emitter is connected to a second signal output terminal; a first capacitor, one end of which is connected to the collector of the first transistor, and the other end of which is connected to the emitter of the first transistor; a second capacitor, one end of which is connected to the collector of the second transistor, and the other end of which is connected to the emitter of the second transistor; a constant current source configured to supply a constant current to the first and second transistors; and a switch circuit connected between the emitters of the first and second transistors and the constant current source, and is configured to alternately turn the first and second transistors to an ON state in response to differential clock signals.

Moreover, in a configuration example of the track-and-hold circuit of embodiments of the present invention, the switch circuit is configured of: a third transistor, in which a base is connected to a positive-phase clock input terminal, a collector is connected to the emitter of the first transistor, and an emitter is connected to the constant current source; and a fourth transistor, in which a base is connected to a negative-phase clock input terminal, a collector is connected to the emitter of the second transistor, and an emitter is connected to the constant current source.

Moreover, a track-and-hold circuit of embodiments of the present invention includes: a first transistor, in which a base is connected to a positive-phase signal input terminal, a power supply voltage is applied to a collector, and an emitter is connected to a first positive-phase signal output terminal; a second transistor, in which a base is connected to a negative-phase signal input terminal, the power supply voltage is applied to a collector, and an emitter is connected to a first negative-phase signal output terminal; a third transistor, in which a base is connected to the positive-phase signal input terminal, the power supply voltage is applied to a collector, and an emitter is connected to a second positive-phase signal output terminal; a fourth transistor, in which a base is connected to the negative-phase signal input terminal, the power supply voltage is applied to a collector, and an emitter is connected to a second negative-phase signal output terminal; a first capacitor, one end of which is connected to the collector of the first transistor, and the other end of which is connected to the emitter of the first transistor; a second capacitor, one end of which is connected to the collector of the second transistor, and the other end of which is connected to the emitter of the second transistor; a third capacitor, one end of which is connected to the collector of the third transistor, and the other end of which is connected to the emitter of the third transistor; a fourth capacitor, one end of which is connected to the collector of the fourth transistor, and the other end of which is connected to the emitter of the fourth transistor; a constant current source configured to supply a constant current to the first, second, third, and fourth transistors; and a switch circuit connected between the emitters of the first, second, third, and fourth transistors and the constant current source, and is configured to alternately turn a first differential circuit comprising the first and second transistors and a second differential circuit comprising the third and fourth transistors to an ON state in response to differential clock signals.

Moreover, in a configuration example of the track-and-hold circuit of embodiments of the present invention, the switch circuit is configured of: a fifth transistor, in which a base is connected to a positive-phase clock input terminal, a collector is connected to the emitter of the first transistor, and an emitter is connected to the constant current source; a sixth transistor, in which a base is connected to the positive-phase clock input terminal, a collector is connected to the emitter of the second transistor, and an emitter is connected to the constant current source; a seventh transistor, in which a base is connected to a negative-phase clock input terminal, a collector is connected to the emitter of the third transistor, and an emitter is connected to the constant current source; and an eighth transistor, in which a base is connected to the negative-phase clock input terminal, a collector is connected to the emitter of the fourth transistor, and an emitter is connected to the constant current source.

Effects of Embodiments of the Invention

According to embodiments of the present invention, by alternately turning the first and second transistors to the ON state in response to the differential clock signals, it is possible to switch the circuit to enter the track mode and the circuit to enter the hold mode every half period of the differential clock signal, and thereby the data rate twice as high as that of the conventional track-and-hold circuit can be achieved.

Moreover, in embodiments of the present invention, by alternately turning the first differential circuit configured of the first and second transistors and the second differential circuit configured of the third and fourth transistors to the ON state in response to the differential clock signals, it is possible to switch the differential circuit to enter the track mode and the differential circuit to enter the hold mode every half period of the clock signal, and thereby the data rate twice as high as that of the conventional track-and-hold circuit can be achieved.

DETAILED DESCRIPTION OF ILLUSTRATIVE EMBODIMENTS

First Embodiment

Figure 1:
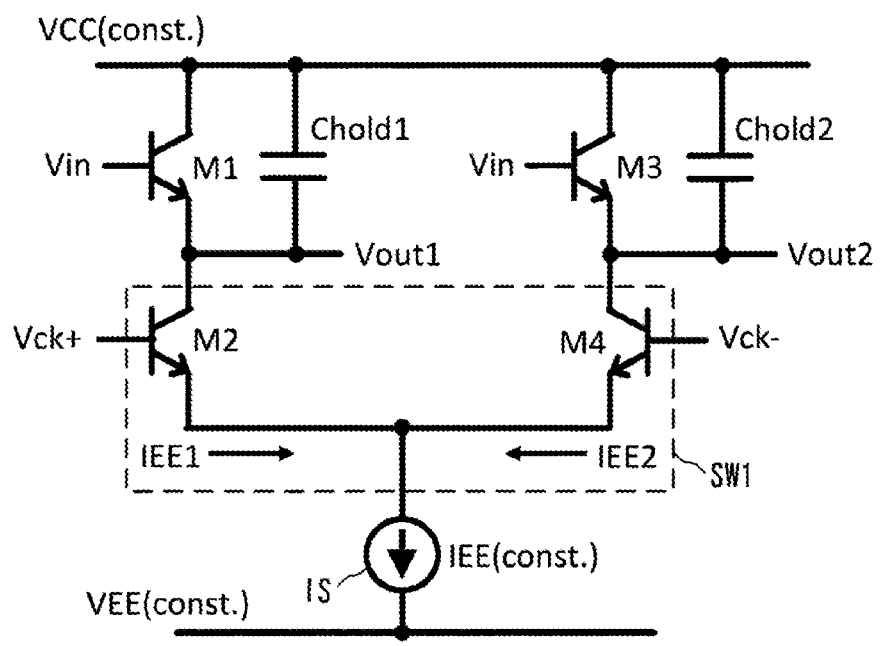
FIG. 1 is a circuit diagram showing a configuration of a track-and-hold circuit related to a first embodiment of the present invention.

Hereinafter, embodiments of the present invention will be described with reference to drawings. FIG. 1 is a circuit diagram showing a configuration of a track-and-hold circuit related to a first embodiment of the present invention. In FIG. 1, VCC and VEE are power supply voltages, Vin is an input signal, Vout is an output signal, and Vck+ and Vck− are clock signals. The clock signals Vck+ and Vck− are differential signals. In addition, (const.) in FIG. 1 indicates that the voltage or the current is constant regardless of time.

The track-and-hold circuit of the embodiment includes: a bipolar transistor M1, in which a base is connected to a signal input terminal (Vin), a power supply voltage VCC is applied to a collector, and an emitter is connected to a first signal output terminal (Vout1); a bipolar transistor M2, in which a base is connected to a positive-phase clock input terminal (Vck+), and a collector is connected to the emitter of the bipolar transistor M1; a bipolar transistor M3, in which a base is connected to the signal input terminal (Vin), the power supply voltage VCC is applied to a collector, and an emitter is connected to a second signal output terminal (Vout2); and a bipolar transistor M4, in which a base is connected to a negative-phase clock input terminal (Vck−), and a collector is connected to the emitter of the bipolar transistor M3.

Further, the track-and-hold circuit also includes: a capacitor Chold1, one end of which is connected to the collector of the bipolar transistor M1 and the other end of which is connected to the emitter of the bipolar transistor M1; a capacitor Chold2, one end of which is connected to the collector of the bipolar transistor M3 and the other end of which is connected to the emitter of the bipolar transistor M3; and a constant current source IS, one end of which is connected to the emitters of the bipolar transistors M2 and M4 and the other end of which is connected to a power supply voltage VEE.

The constant current source IS is configured of transistors, etc., in many cases. IEE1 and IEE2 are currents flowing into the constant current source IS from the emitters of the bipolar transistors M2 and M4. Assuming that the current flowing to the constant current source IS is IEE, then IEE1+IEE2=IEE due to Kirchhoff's current law.

The transistors M2 and M4 constitute a switch circuit SW1 that alternately turns the transistors M1 and M2 to the ON state in response to the differential clock signals Vck+ and Vck−.

Figure 2A:
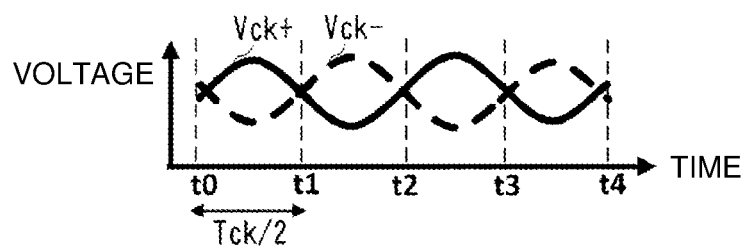
FIGS. 2A to 2F are diagrams showing signal waveforms of each part of the track-and-hold circuit related to the first embodiment of the present invention.
Figure 2B:
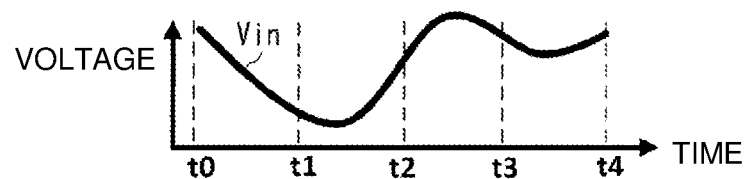
Figure 2C:
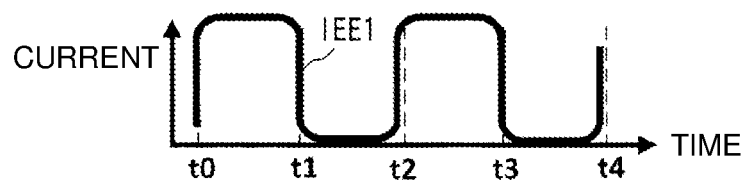
Figure 2D:
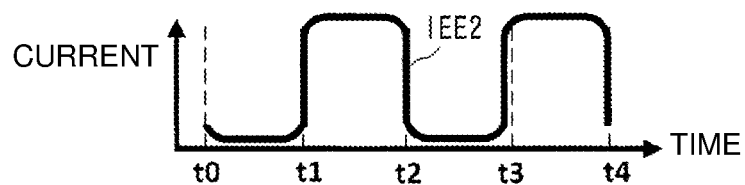
Figure 2E:
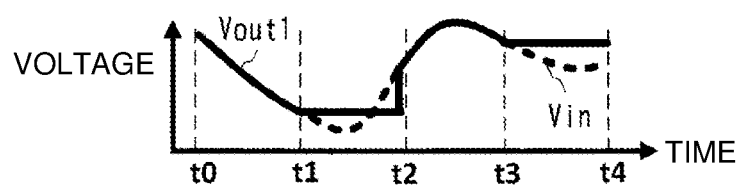
Figure 2F:
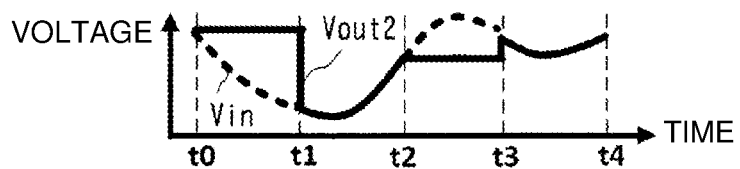

The basic operation of the track-and-hold circuit in FIG. 1 will be described using FIGS. 2A to 2F. Here, the waveforms of the currents IEE1 and IEE2, when the differential clock signals Vck+ and Vck− with a period Tck shown in FIG. 2A and the input signal Vin shown in FIG. 2B are applied to the track-and-hold circuit, are shown in FIGS. 2C and 2D, and the waveforms of the output signals Vout1 and Vout2 at that time are shown in FIGS. 2E and 2F. In FIGS. 2A to 2F, t0, t1, t2, t3, and t4 represent times. The times t0 to t4 are arranged with constant intervals Tck/2.

When the clock signal is High, that is, Vck+>Vck− (when the time t satisfies t0≤t≤t1 or t2≤t≤t3), the transistor M2 is turned ON and the transistor M4 is turned OFF; therefore, IEE1=IEE, and IEE2=0. At this time, since the PN junction between the base and the emitter of the transistor M1 is in the ON state, the emitter voltage of the transistor M1 (the output signal Vout1) follows the input signal Vin.

On the other hand, since no current flows to the transistors M3 and M4, the PN junction between the base and the emitter of the transistor M3 is in the OFF state, and the base and the emitter of the transistor M3 are electrically separated. At this time, the emitter voltage of the transistor M3 (the output signal Vout2) at the moment when the clock signal changes from Low to High is retained in the capacitor Chold2; therefore, the output signal Vout2 is kept at a constant value while the clock signal is High.

In this manner, when the clock signal is High (when the time t satisfies t0≤t≤t1 or t2≤t≤t3), a first circuit configured of the transistor M1 and the capacitor Chold1 is in the track mode, and a second circuit configured of the transistor M3 and the capacitor Chold2 is in the hold mode.

On the contrary, when the clock is Low, that is, Vck+<Vck− (when the time t satisfies t1≤t≤t2 or t3≤t≤t4), the transistor M2 is turned OFF and the transistor M4 is turned ON; therefore, IEE1=0, and IEE2=IEE. At this time, the first circuit configured of the transistor M1 and the capacitor Chold1 is in the hold mode, and the second circuit configured of the transistor M3 and the capacitor Chold2 is in the track mode.

In other words, in this embodiment, by operating the first circuit and the second circuit complementarily, the circuit that is to enter the track mode and the circuit that is to enter the hold mode can be switched every half period Tck/2 of the clock signal.

Figure 6:
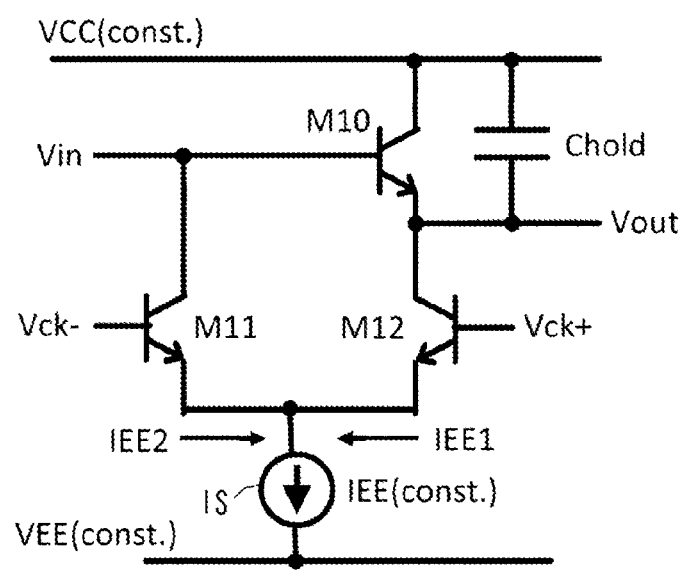
FIG. 6 is a circuit diagram showing a configuration of a conventional track-and-hold circuit.
Figure 7A:
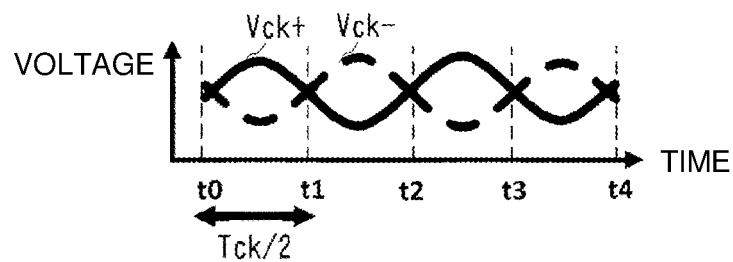
FIGS. 7A to 7E are diagrams showing signal waveforms of each part of the conventional track-and-hold circuit.
Figure 7B:
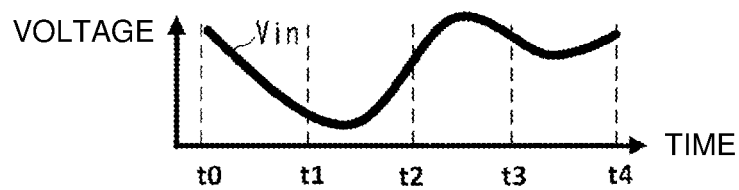
Figure 7C:
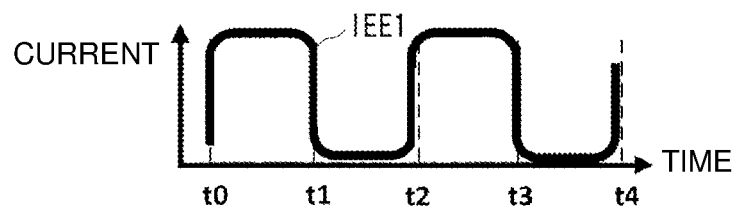
Figure 7D:
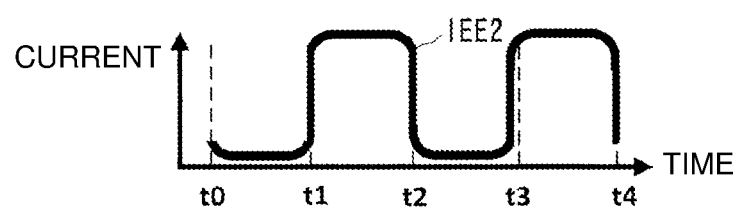
Figure 7E:
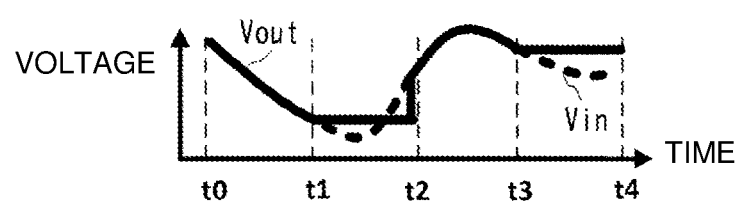

Since, in this embodiment, the parasitic resistance and the parasitic capacitance existing in transistors and wiring are similar to those of the conventional circuit configurations, the upper limit of the clock frequency that can be inputted is the same as before. However, since the circuit that is to enter the track mode and the circuit that is to enter the hold mode is switched every half period Tck/2 of the clock signal as described above, as compared to the conventional circuit configuration shown in FIG. 6, despite the same conditions as before where the clock signal with the same frequency is used, the input signal can be obtained at half time intervals; therefore, the data rate can be doubled. Consequently, according to this embodiment, speeding up of the track-and-hold circuit can be achieved.

Note that, in the case where the track-and-hold circuit of this embodiment is connected to an ADC in a latter part, an ADC with the output signal Vout1 as the input and an ADC with the output terminal Vout2 as the input may be separately provided, and digital signals outputted from the two ADCs may be synthesized.

In addition, a multiplexer may be provided between the track-and-hold circuit of this embodiment and an ADC, and thereby the multiplexer may be switched to always select and output one of the output signals Vout1 and Vout2, which is synchronous to the clock signal and in the hold mode state, to the ADC.

Second Embodiment

Figure 3:
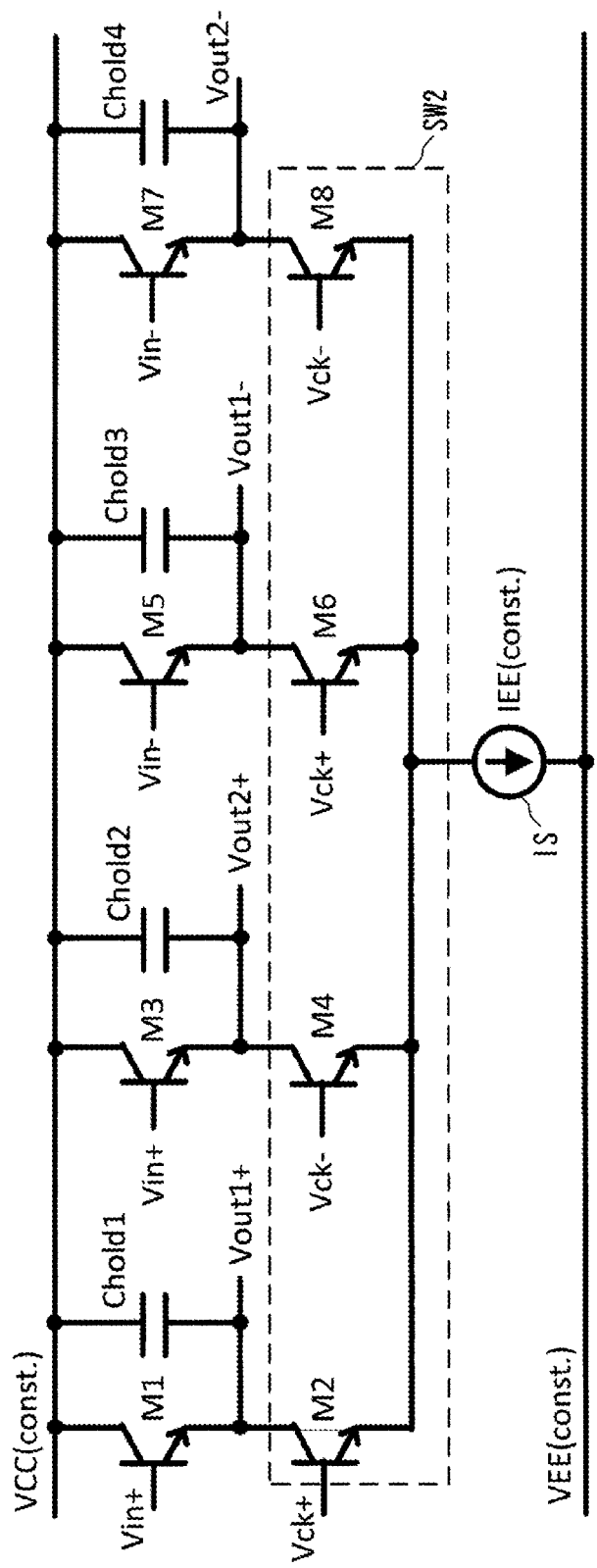
FIG. 3 is a circuit diagram showing a configuration of a track-and-hold circuit related to a second embodiment of the present invention.

Next, a second embodiment of the present invention will be described. FIG. 3 is a circuit diagram showing a configuration of a track-and-hold circuit related to the second embodiment of the present invention. The track-and-hold circuit of this embodiment includes: a bipolar transistor M1, in which a base is connected to a positive-phase signal input terminal (Vin+), a power supply voltage VCC is applied to a collector, and an emitter is connected to a first positive-phase signal output terminal (Vout1+); a bipolar transistor M2, in which a base is connected to a positive-phase clock input terminal (Vck+), and a collector is connected to the emitter of the bipolar transistor M1; a bipolar transistor M3, in which a base is connected to the positive-phase signal input terminal (Vin+), the power supply voltage VCC is applied to a collector, and an emitter is connected to a second positive-phase signal output terminal (Vout2+); a bipolar transistor M4, in which a base is connected to a negative-phase clock input terminal (Vck−), and a collector is connected to the emitter of the bipolar transistor M3; a bipolar transistor M5, in which a base is connected to a negative-phase signal input terminal (Vin−), the power supply voltage VCC is applied to a collector, and an emitter is connected to a first negative-phase signal output terminal (Vout1−); a bipolar transistor M6, in which a base is connected to the positive-phase clock input terminal (Vck+), and a collector is connected to the emitter of the bipolar transistor M5; a bipolar transistor M7, in which a base is connected to the negative-phase signal input terminal (Vin−), the power supply voltage VCC is applied to a collector, and an emitter is connected to a second negative-phase signal output terminal (Vout2−); and a bipolar transistor M8, in which a base is connected to the negative-phase clock input terminal (Vck−), and a collector is connected to the emitter of the bipolar transistor M7.

Further, the track-and-hold circuit also includes: a capacitor Chold1, one end of which is connected to the collector of the bipolar transistor M1 and the other end of which is connected to the emitter of the bipolar transistor M1; a capacitor Chold2, one end of which is connected to the collector of the bipolar transistor M3 and the other end of which is connected to the emitter of the bipolar transistor M3; a capacitor Chold3, one end of which is connected to the collector of the bipolar transistor M5 and the other end of which is connected to the emitter of the bipolar transistor M5; a capacitor Chold4, one end of which is connected to the collector of the bipolar transistor M7 and the other end of which is connected to the emitter of the bipolar transistor M7; and a constant current source IS, one end of which is connected to the emitters of the bipolar transistors M2, M4, M6, and M8 and the other end of which is connected to a power supply voltage VEE.

The transistors M2, M4, M6, and M8 constitute a switch circuit SW2 that alternately turns a first differential circuit configured of the transistors M1 and M5 and a second differential circuit configured of the transistors M3 and M7 to the ON state in response to the differential clock signals Vck+ and Vck−.

Figure 4A:
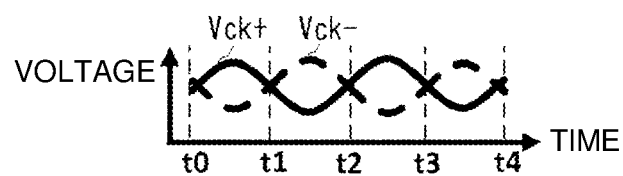
FIGS. 4A to 4G are diagrams showing signal waveforms of each part of the track-and-hold circuit related to the second embodiment of the present invention.
Figure 4B:
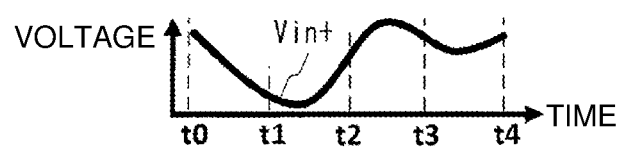
Figure 4C:
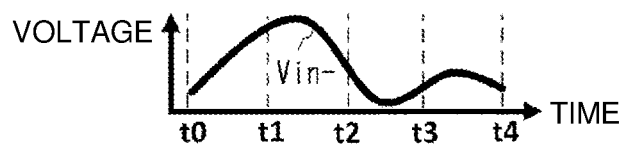
Figure 4D:
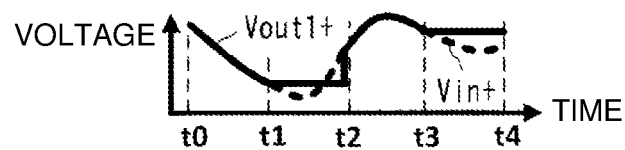
Figure 4E:
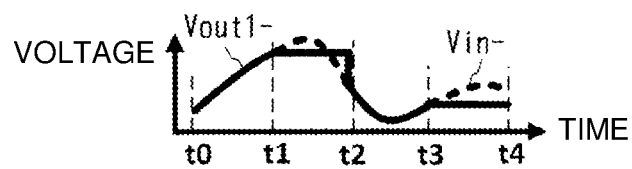
Figure 4F:
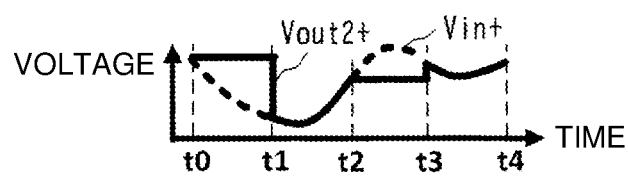
Figure 4G:
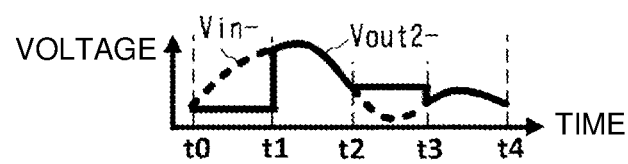
Figure 5:
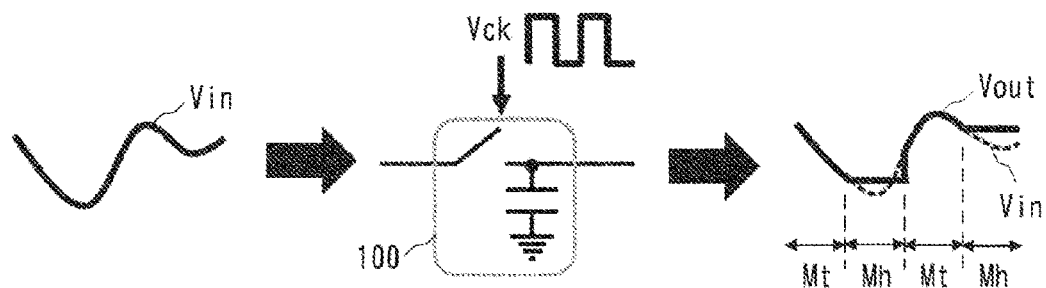
FIG. 5 is a diagram conceptually illustrating the configuration and operation of the track-and-hold circuit.

The basic operation of the track-and-hold circuit in FIG. 3 will be described using FIGS. 4A to 4F. Here, the waveforms of differential output signals Vout1+ and Vout1−, when the differential clock signals Vck+ and Vck− with a period Tck shown in FIG. 4 and differential input signals Vin+ and Vin− shown in FIGS. 4B and 4C are applied to the track-and-hold circuit, are shown in FIGS. 4D and 4E, and the waveforms of the differential output signals Vout2+ and Vout2− at that time are shown in FIGS. 4F and 4G.

When the clock signal is High, that is, Vck+>Vck− (when the time t satisfies t0≤t≤t1 or t2≤t≤t3), the transistors M2 and M6 are ON, the transistors M4 and M8 are OFF, and the PN junction between the base and the emitter of the transistors M1 and M5 is in the ON state; therefore, the emitter voltage of the transistor M1 (the output signal Vout1+) follows the input signal Vin+ and the emitter voltage of transistor M5 (the output signal Vout1−) follows the input signal Vin−.

On the other hand, since no current flows to the transistors M3, M4, M7, and M8, the PN junction between the base and the emitter of each of the transistors M3 and M7 is in the OFF state, and the base and the emitter of each of the transistors M3 and M7 are electrically separated. At this time, the emitter voltage of the transistor M3 (the output signal Vout2+) at the moment when the clock signal changes from Low to High is retained in the capacitor Chold2; therefore, the output signal Vout2+ is kept at a constant value while the clock signal is High. Similarly, the emitter voltage of the transistor M7 (the output signal Vout2−) at the moment when the clock signal changes from Low to High is retained in the capacitor Chold4; therefore, the output signal Vout2− is kept at a constant value while the clock signal is High.

In this manner, when the clock signal is High (when the time t satisfies t0≤t≤t1 or t2≤t≤t3), a first differential circuit configured of the transistors M1, M5 and the capacitors Chold1, Chold3 is in the track mode, and a second differential circuit configured of the transistors M3, M7 and the capacitors Chold2, Chold4 is in the hold mode.

On the contrary, when a clock is Low, that is, Vck+<Vck− (when the time t satisfies t1≤t≤t2 or t3≤t≤t4), the transistors M2 and M6 are OFF and the transistors M4 and M8 are ON. At this time, the first differential circuit configured of the transistors M1, M5 and the capacitors Chold1, Chold3 is in the hold mode, and the second differential circuit configured of the transistors M3, M7 and the capacitors Chold2, Chold4 is in the track mode.

In other words, in this embodiment, by operating the first differential circuit and the second differential circuit complementarily, the differential circuit that is to enter the track mode and the differential circuit that is to enter the hold mode can be switched every half period Tck/2 of the clock signal.

Thus, in this embodiment, the differential configuration is provided not only to the clock-input transistor but also to the signal-input transistor; accordingly, it becomes possible to eliminate in-phase noise or non-linear distortion. In addition, unification of the constant current source IS as shown in FIG. 3 enables to achieve reduction in area of the circuit scale.

Note that the connection mode between the track-and-hold circuit and the ADC in the latter part is similar to that of the first embodiment. In the case where two ADCs are used, an ADC of a differential input type with the differential output signals Vout1+ and Vout1− as the input and an ADC of a differential input type with the differential output signals Vout2+ and Vout2− as the input may be provided.

In the case where a multiplexer is used, a multiplexer of a differential input/differential output type, which selects the differential output signal in the hold mode state from the differential output signals Vout1+, Vout1− and the differential output signals Vout2+, Vout2− and outputs thereof, and an ADC of the differential input type with the differential output signal from the multiplexer as the input may be provided. Alternatively, a multiplexer of a differential input/single-phase output type that converts the differential output signal in the hold mode state, which is selected from the differential output signals Vout1+, Vout1− and the differential output signals Vout2+, Vout2−, into a single-phase signal and outputs thereof, and an ADC of a single-phase input type with the output signal from the multiplexer as the input may be provided.

The above-described embodiments merely show one case of application to assist in understanding the principles of the present invention, and the embodiments in the practical situation are allowed to have many variations within a scope that does not deviate from the idea of the present invention.

INDUSTRIAL APPLICABILITY

Embodiments of the present invention can be applied to a track-and-hold circuit.

REFERENCE SIGNS LIST

M1 to M8 Bipolar transistor
Chold1 to Chold4 Capacitor
IS Constant current source
SW1, SW2 Switch circuit.

The invention claimed is:

1. A track-and-hold circuit comprising:
a first transistor comprising a base connected to a signal input terminal, a collector connected to a power supply voltage, and an emitter connected to a first signal output terminal;
a second transistor comprising a base is connected to the signal input terminal, a collector connected to the power supply voltage, and an emitter connected to a second signal output terminal;
a first capacitor comprising a first end connected to the collector of the first transistor and a second end connected to the emitter of the first transistor;
a second capacitor comprising a first end connected to the collector of the second transistor a second end connected to the emitter of the second transistor;
a constant current source configured to sink a constant current from the first transistor and the second transistor; and
a switch circuit connected between the emitter of the first transistor and the constant current source, the switch circuit being further connected between the emitter of the second transistor and the constant current source, the switch circuit being configured to alternately turn the first transistor and the second transistor to an ON state in response to differential clock signals, wherein the switch circuit comprises a third transistor and a fourth transistor, a collector of the third transistor being connected to the emitter of the first transistor, a collector of the fourth transistor being connected to the emitter of the second transistor, and an emitter of the third transistor being directly connected to an emitter of the fourth transistor and the constant current source.

2. The track-and-hold circuit according to claim 1, wherein:
the third transistor comprises a base connected to a positive-phase clock input terminal.

3. The track-and-hold circuit according to claim 2, wherein:
the fourth transistor comprises a base connected to a negative-phase clock input terminal.

4. A track-and-hold circuit comprising:
a first transistor comprising a base connected to a positive-phase signal input terminal, a collector connected to a power supply voltage, and an emitter connected to a first positive-phase signal output terminal;
a second transistor comprising a base connected to a negative-phase signal input terminal, a collector connected to the power supply voltage, and an emitter connected to a first negative-phase signal output terminal;
a third transistor comprising a base connected to the positive-phase signal input terminal, a collector connected to the power supply voltage, and an emitter connected to a second positive-phase signal output terminal;
a fourth transistor comprising a base connected to the negative-phase signal input terminal, a collector connected to the power supply voltage, and an emitter connected to a second negative-phase signal output terminal;
a first capacitor comprising a first end connected to the collector of the first transistor and a second end connected to the emitter of the first transistor;
a second capacitor comprising a first end connected to the collector of the second transistor and a second end connected to the emitter of the second transistor;
a third capacitor comprising a first end connected to the collector of the third transistor and a second end connected to the emitter of the third transistor;
a fourth capacitor comprising a first end connected to the collector of the fourth transistor and a second end connected to the emitter the fourth transistor;
a constant current source configured to sink a constant current from the first transistor, the second transistor, the third transistor, and the fourth transistor; and
a switch circuit connected between the emitters of the first, second, third, and fourth transistors and the constant current source, and the switch circuit being configured to alternately turn a first differential circuit comprising the first and second transistors and a second differential circuit comprising the third and fourth transistors to an ON state in response to differential clock signals, wherein the switch circuit comprises a fifth transistor and a sixth transistor, a collector of the fifth transistor being connected to the emitter of the first transistor, a collector of the sixth transistor being connected to the emitter of the second transistor, and an emitter of the fifth transistor being directly connected to an emitter of the sixth transistor and the constant current source.

5. The track-and-hold circuit according to claim 4, wherein:
the fifth transistor comprises a base connected to a positive-phase clock input terminal.

6. The track-and-hold circuit according to claim 5, wherein:
the sixth transistor comprises a base connected to the positive-phase clock input terminal.

7. The track-and-hold circuit according to claim 6, wherein the switch circuit further comprises:
a seventh transistor comprising a base connected to a negative-phase clock input terminal, a collector connected to the emitter of the third transistor, and an emitter directly connected to the emitter of the fifth transistor, the emitter of the sixth transistor, and the constant current source.

8. The track-and-hold circuit according to claim 7, wherein the switch circuit further comprises:
an eighth transistor comprising a base connected to the negative-phase clock input terminal, a collector connected to the emitter of the fourth transistor, and an emitter directly connected to the emitter of the fifth transistor, the emitter of the sixth transistor, the emitter of the seventh transistor, and the constant current source.

9. A track-and-hold circuit comprising:
a first transistor comprising a base connected to a signal input terminal, a collector connected to a power supply voltage, and an emitter connected to a first signal output terminal;
a second transistor comprising a base is connected to the signal input terminal, a collector connected to the power supply voltage, and an emitter connected to a second signal output terminal;
a constant current source configured to sink a constant current from the first transistor and the second transistor; and
a switch circuit connected between the emitter of the first transistor and the constant current source, the switch circuit being further connected between the emitter of the second transistor and the constant current source, the switch circuit being configured to alternately turn the first transistor and the second transistor to an ON state in response to differential clock signals, wherein the switch circuit comprises a third transistor and a fourth transistor, a collector of the third transistor being connected to the emitter of the first transistor, a collector of the fourth transistor being connected to the emitter of the second transistor, and an emitter of the third transistor being directly connected to an emitter of the fourth transistor and the constant current source.

10. The track-and-hold circuit according to claim 9 further comprising:
a first capacitor comprising a first end connected to the collector of the first transistor and a second end connected to the emitter of the first transistor.

11. The track-and-hold circuit according to claim 9 further comprising:
a second capacitor comprising a first end connected to the collector of the second transistor a second end connected to the emitter of the second transistor.

12. The track-and-hold circuit according to claim 9, wherein:
the third transistor comprises a base connected to a positive-phase clock input terminal.

13. The track-and-hold circuit according to claim 12, wherein:
the fourth transistor comprises a base connected to a negative-phase clock input terminal.

\* \* \* \* \*